United States Patent [19]

Schropp et al.

[11] Patent Number: 5,032,951
[45] Date of Patent: Jul. 16, 1991

[54] MODULE FOR A CONTROL SYSTEM COMPRISING SEVERAL MODULES JUXTAPOSED ON A CARRIER

[75] Inventors: Klaus Schropp, Sulzberg-Graben; Gerhard J. Gügel, Diessen a. A., both of Fed. Rep. of Germany

[73] Assignee: Schleicher Electronic GmbH & Co. KG., Oberschleissheim, Fed. Rep. of Germany

[21] Appl. No.: 331,798

[22] Filed: Apr. 3, 1989

[30] Foreign Application Priority Data

Apr. 20, 1989 [DE] Fed. Rep. of Germany ....... 3813888

[51] Int. Cl.$^5$ ............................................. H05K 7/14
[52] U.S. Cl. ................................... 361/391; 312/223; 361/415; 361/428; 439/377
[58] Field of Search ................ 439/64, 377, 488, 490, 439/491; 211/41; 312/223; 361/331, 334, 380, 390, 391, 393, 394, 395, 399, 415, 428

[56] References Cited

U.S. PATENT DOCUMENTS

| 4,002,955 | 1/1977 | Eggert | 361/391 |
| 4,226,491 | 10/1980 | Kazama et al. | 361/399 |
| 4,361,861 | 11/1982 | Spapens | 361/391 |
| 4,386,388 | 5/1983 | Beun | 361/399 |
| 4,429,937 | 2/1984 | Stockmaster | 361/415 |
| 4,491,981 | 1/1985 | Weller | 361/391 |
| 4,546,407 | 10/1985 | Benenati | 361/415 |
| 4,716,497 | 12/1987 | Craker | 361/395 |
| 4,780,631 | 10/1988 | Groeninger | 310/71 |
| 4,784,614 | 11/1988 | Behzadi | 439/488 |
| 4,793,495 | 12/1988 | Preu | 211/41 |

FOREIGN PATENT DOCUMENTS

| 1106047 | 7/1981 | Canada. |
| 6938562 | 2/1970 | Fed. Rep. of Germany. |
| 7009198 | 9/1970 | Fed. Rep. of Germany. |
| 7148246 | 5/1973 | Fed. Rep. of Germany. |
| 2435914 | 2/1976 | Fed. Rep. of Germany. |
| 3019596A1 | 11/1981 | Fed. Rep. of Germany. |
| 3211758C2 | 6/1988 | Fed. Rep. of Germany. |
| 1214388 | 12/1970 | United Kingdom ............... 361/391 |

Primary Examiner—Gerald P. Tolin

[57] ABSTRACT

A module is proposed for a control system comprising several modules juxtaposed on a carrier, particularly an analog input/output module for receiving inputs and/or outputs. The circuit parts common to all the inputs and/or outputs are located on circuit board, whilst the specific circuit for each input and/or output is in each case provided on a separate circuit board. The circuit boards are received in sliding blocks, which can be inserted in the module casing from the front. For this purpose the casing contains several superimposed guides. The electrical connection is formed when the sliding blocks are inserted by means of plug connections which are located on the circuit board with the common circuit and the circuit boards with the specific circuits.

18 Claims, 2 Drawing Sheets

MODULE FOR A CONTROL SYSTEM COMPRISING SEVERAL MODULES JUXTAPOSED ON A CARRIER

BACKGROUND OF THE INVENTION

The invention relates to a module for a control system or means comprising several modules juxtaposed on a carrier and in particular for receiving analog inputs and/or outputs with at least one circuit board arranged in a casing or enclosure.

For controlling handing equipment, numerical machines and the like, use is made of control system comprising several modules constructed as flat assemblies, the modules being received on a carrier and can e.g. be swung in. The modules and the carrier have frame connector, which can be plugged into one another and in this way form an electrical connection. The modules which, according to the function and control presetting can be specially constructed and whose number can also vary, generally have a flat, rectangular casing, which receives one or more circuit boards equipped with components. Indicators, switches, plugs, etc. can be arranged in the front panel. For control purposes it is also necessary to have an input/output module, plug connections being provided along any indicators in the front panel. Conventionally these plug connections are covered by one or more lids or flaps and behind the latter are formed cable ducts for the lines to be connected to the plug or frame connector. In the case of known analog input/output modules there are a maximum of one to two inputs or outputs and if the nature of the inputs and/or outputs in a control system is to be modified, it is necessary to replace the entire module.

The problem of the invention is to provide a module for a control system, particularly an input/output module, which can receive a large number of different inputs and/or outputs and in which it is possible to simplify and speed up the replacement of inputs and/or outputs.

SUMMARY OF THE INVENTION

According to the invention this problem is solved by providing a modular casing or rack having a plurality of superimposed guides for receiving a like plurality of sliding blocks or enclosures. Each block or enclosures, contains at least one circuit board, and includes an input and output which is automatically engaged upon insertion of the block into the rack or casing.

Due to the fact that the casing contains several superimposed guides for receiving sliding blocks, an input or output being associated with each of the latter and that the sliding blocks can be slid into the guides from the front, the particular inputs or outputs can be rapidly replaced by simply removing a sliding block and inserting a different sliding block. As a result of the sliding arrangement, it is also possible to receive in a single module a larger number of inputs or outputs.

Advantageous further developments and improvements are possible through the measures given in the subclaims. Due to the fact that the circuits of the inputs and/or outputs are separated in such a way that the circuit board carries a circuit usable for all the inputs and/or outputs and in a casing of each sliding block is provided in each case one circuit board with a circuit specific for the particular input or output, in which the circuits are interconnected by means of plug connections, a considerably larger number of inputs or outputs can be housed in one module. As a result the manufacture of an input/output module is much less expensive.

The invention is described in greater detail hereinafter relative to a non-limitative embodiment and the attached drawings, wherein show:

DESCRIPTION OF THE PREFERRED EMBODIMENT

Figures 1, 2:
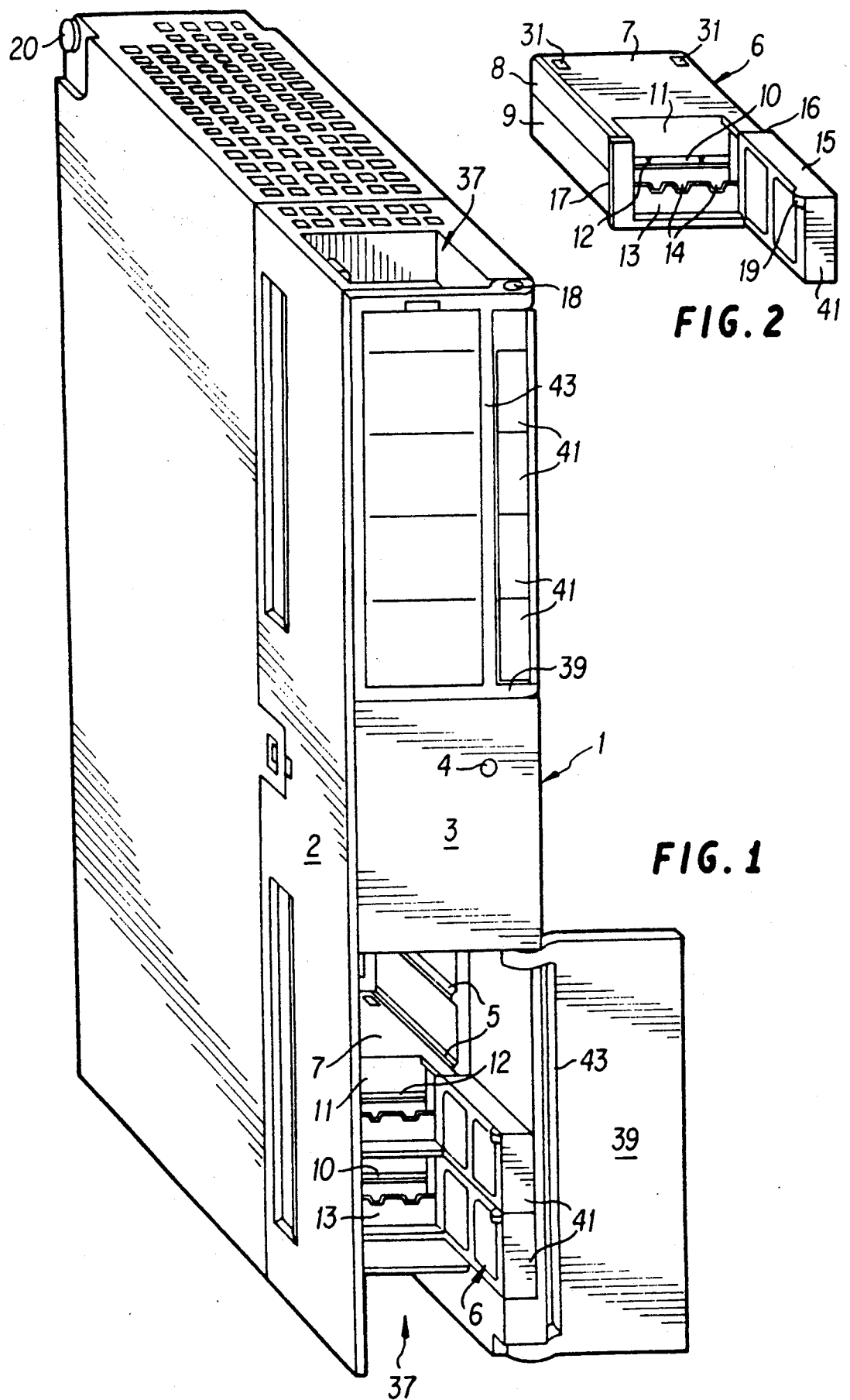
FIG. 1 is a three dimensional view of the module from the front and wherein the bottom cover is open to show two sliding blocks slid into the guides.
FIG. 2 is a three dimensional view of a sliding block.
Figure 3:
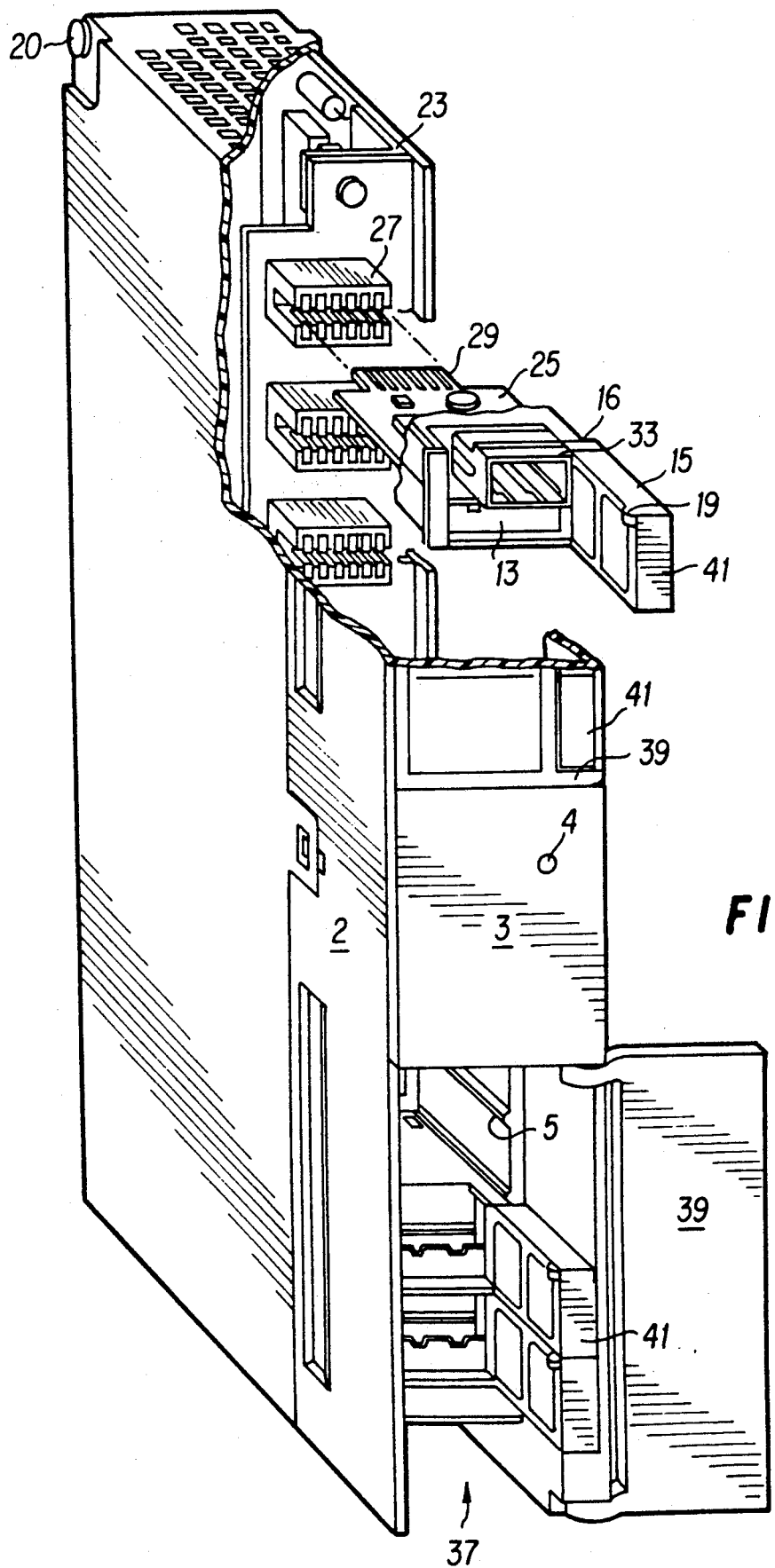
FIG. 3 is a view similar to FIG. 1 having a top portion cut-away to show internal parts of the module.

FIG. 1 shows an analog input/output module 1 from the front. This module has a flat casing or rack 2, which is provided on the back with a frame connector (not shown) connectable to a corresponding plugging arrangement on a carrier (not shown) and which provides the electric power supply for the module. The module 1 has a pivot 20 for mounting to the carrier. The front of the module 1 has a closed or sealed central part 3, which carries indicators, e.g. light-emitting diodes 4.

Above and below said central part 3, the casing has superimposed guides 5, which terminate in a certain depth of the casing 2. On guides 5 are slide sliding blocks 6, as shown in FIG. 2, it being possible to receive four sliding blocks 6 both above and below the central part 3.

In the rear part of module 1 is provided a circuit board 23 which carries a circuit forming part of the input and/or output circuits. The input and output circuits are divided up in such a way that the circuit part usable for all input and/or output parts together is provided on one circuit board 23 in the rear part of the module 1, while the circuit specific for each input and/or output is provided on another circuit board 25 in each case associated with a sliding block 6. For this purpose a casing or enclosure 7 of each sliding block 6 contains a circuit board 25 with the specific circuit. The circuit boards with the specific circuits and the circuit board with the common circuit have at corresponding points strips of plug connections 27, 29, which come into contact if the sliding blocks 6 are placed on guides 5 and slid rearwardly.

The casing 7 of each sliding block 6 comprises two parts 8, 9, which can be locked together by means of corresponding detents 31 provided on the rear ends of casing parts 8, 9. Casing 7 of sliding block 6 has a front terminating wall 11 interrupted by a slit 10 and a corresponding wall is provided on the back of the casing. The slits 10 are used as a passage for the circuit board 25 with the specific circuit. Retaining studs 12 shaped onto the front wall 11 or the rear wall project into slit 10 and engage in corresponding depressions in the circuit board and in this way fix the latter in the block 6. In front of the front wall 11 is provided a support wall 13, which has recesses 14, the circuit board 25 with the specific circuit resting on or terminating with said support wall. On said front end of the circuit board with the specific circuit is also arranged part of a plug connection 33, the other part of the latter being connected on the user side with corresponding lines. Support wall 13 with recesses 14 is also used for fixing and retaining the plug connection 33.

On casting 7 of sliding block 6 is laterally shaped a grip 15, which extends forwards in the sliding direction. Grip 15 serves for the insertion or removal of sliding block 6. In the inserted state the end 41 of grip 15 terminates with the central part 3 or with the front panel. At the transition from grip 15 to the remaining casing 7 is provided a shoulder 16, while a corresponding shoulder 17 is shaped on laterally facing the same. These shoulders 16, 17 serve as stops for sliding block 6 in the inserted state.

FIG. 1 shows a module 1 in a partially uncovered state. In order to cover the front of the module and give it an optically attractive form, flaps or cover lids 39 are provided, which can be pivoted about pivot points 18. When the covers or flaps are closed, the latter, in the same way as the front ends 41 of the grips 15, which are also visible when the flaps are closed, terminate with the central part 3, so that a smooth front surface is obtained. Behind the cover flaps 39, cable ducts 37 are formed alongside the grips 15 and the user side of these have plugs 33 that are connected with lines (not shown) from the bottom and top to the corresponding plug parts of the circuit boards of sliding block 6. In order for the sliding blocks 6 to be fixed when the flaps are in the closed state, retaining studs 19 are shaped laterally onto the grips 15 of sliding block 6 and in the closed state the cover flaps 39 have a side 43, next to the opening 49 for the ends 41 of the grips 15 to press against the studs 19, so that even in the case of vibrations or the like blocks 6 they cannot become loose. It is possible to ensure a safe and reliable electrical connection between the circuit boards with the specific circuits and the circuit board with the common circuit by means of plug connections.

The casing 7 and/or grips 15 of sliding block 6 have different colors corresponding to the functions of sliding blocks 6, e.g. different colors are used for the input, output and special blocks. As the ends 41 of the grips 15 are also visible through opening 45 when the front cover flaps are closed, a rapid distinction between the sliding blocks 6 can be made as a result of the different colors.

In summarizing, it can be stated that through the subdivision of the analog input and/or output circuits into a common circuit usable for all the inputs and outputs on a mounting plate and several circuits associated with the individual inputs and/or outputs, it is possible to create submodules, which have an identical construction to the module, i.e. the common circuit on the mounting plate is connected by means of a bus and corresponding terminals to the particular circuit in the submodule constructed as a sliding block.

We claim:

1. A modular system for electronic controls comprising:
    a rack having a generally planar face, and a plurality of guides arranged generally perpendicular to the face and extending rearwardly from the face;
    a plurality of enclosures, each enclosure engaging at least one of the plurality of guides, each enclosure containing at least one circuit board, each enclosure comprising:
        an upper portion and a lower portion, the at least one circuit board being situated therebetween in a slit defined by confronting surfaces of the upper and lower portions, a front edge of the slit providing access to the circuit board to provide a plug connection thereto,
        a front face defines by the upper and lower portions including retaining means for retaining a plug in connection with the circuit board, and shoulders for engaging the generally planar face of the rack, and
        a grip projecting forwardly from one side of the front face for aiding in the insertion and removal of the enclosure with respect to the rack; and
    a cover pivotally connected to the rack for movement between an open position permitting replacement of the circuit board containing enclosures, and a closed position preventing the replacement of the enclosures.

2. A modular system for electronic controls comprising:
    a rack having a generally planar face, and a plurality of guides arranged generally perpendicular to the face and extending rearwardly from the face, and at least one common circuit provided at the rear of the rack;
    a plurality of enclosures, each enclosure engaging at least one of the plurality of guides, each enclosure containing at least one circuit board having plug connections for engaging the at least one common circuit, each enclosure comprising:
        an upper portion and a lower portion and means locking the upper and lower portions together with the at least one circuit board situated therebetween in a slit defined by confronting surfaces of the upper and lower portions, a front edge of the slit providing access to the circuit board to provide a plug connection thereto,
        a front face defines by the upper and lower portions including retaining means for retaining a plug in connection with the circuit board, and shoulders for engaging the generally planar face of the rack, and
        a grip projecting forwardly from one side of the front face for aiding in the insertion and removal of the enclosure with respect to the rack, the grip having a front surface decorated with a color coded to the function of the circuit board contained by the enclosure; and
    a cover pivotally connected to the rack for movement between an open position permitting replacement of the circuit board containing enclosures, and a closed position laterally aligned with the end of the enclosure grips and engaging a retaining stud on an edge of the grips to prevent their removal, the cover and grips combining to define a cable dust for receiving cable connected to plugs retained by the retaining means, the ends of the grip being visible with the cover in the closed position.

3. A modular system for electronic controls comprising:
    a rack having a generally planar face, and a plurality of guides arranged generally perpendicular to the face and extending rearwardly from the face;
    a circuit board at the rear of the rack and equipped with a plurality of connectors;
    a plurality of enclosures with each enclosure engaging at least one of the guides for guiding the enclosure inwardly of the rack along its respective guide;
    each enclosure having its own individual circuit board located therein and with a rearwardly facing circuit board end that electronically connects with one of the connectors of the circuit board at the rear;

a grip means projecting forwardly of the enclosure to act as a handle to push the enclosure rearwardly along the respective guide so that the enclosures individual circuit board electronically connects to the connector;

a cover pivotally connected to the rack and flush with the front planar face of the rack;

the cover having an opening for receiving an end face of the grip means when the cover is pivoted to a closed position;

the end face of the grip means also lying flush with the front planar face of the rack when the enclosure is connected to its respective connector; and wherein the cover in its closed position defines a closed duct area between the enclosure and a rear face of the cover to house wiring which can electronically connect to a front portion of the individual circuit board of an enclosure in a protected manner.

4. A modular system according to claim 3 wherein the wiring is connectable to a plug which provides the electronic connection to the front side of the individual circuit board.

5. A modular system according to claim 3 wherein the grip means has a positioning stud which is engaged by the rear side of the cover when in a closed position to hold the enclosure in its electronically connected condition with the connector.

6. A modular system according to claim 4 wherein the grip means has a positioning stud which is engaged by the rear side of the cover when in a closed position to hold the enclosure in its electronically connected condition with the connector.

7. A modular system according to claim 3 wherein a plurality of said racks are pivotally mounted to a carrier.

8. A modular system according to claim 4 wherein a plurality of said racks are pivotally mounted to a carrier.

9. A modular system according to claim 5 wherein a plurality of said racks are pivotally mounted to a carrier.

10. A modular system according to claim 6 wherein a plurality of said racks are pivotally mounted to a carrier.

11. A modular system according to claim 3 wherein the end face of the grip means is coded so that a viewer can determine which enclosures are located in the module at each location by viewing the end of the grip that extends through the cover when the cover is in its closed position.

12. A modular system according to claim 4 wherein the end face of the grip means is coded so that a viewer can determine which enclosures are located in the rack at each location by viewing the end of the grip that extends through the cover when the cover is in its closed position.

13. A modular system according to claim 5 wherein the end face of the grip means is coded so that a viewer can determine which enclosures are located in the rack at each location by viewing the end of the grip that extends through the cover when the cover is in its closed position.

14. A modular system according to claim 6 wherein the end face of the grip means is coded so that a viewer can determine which enclosures are located in the rack at each location by viewing the end of the grip that extends through the cover when the cover is in its closed position.

15. A modular system according to claim 7 wherein the end face of the grip means is coded so that a viewer can determine which enclosures are located in the racks at each location by viewing the end of the grip that extends through the cover when the cover is in its closed position.

16. A modular system according to claim 8 wherein the end face of the grip means is coded so that a viewer can determine which enclosures are located in the racks at each location by viewing the end of the grip that extends through the cover when the cover is in its closed position.

17. A modular system according to claim 9 wherein the end face of the grip means is coded so that a viewer can determine which enclosures are located in the racks at each location by viewing the end of the grip that extends through the cover when the cover is in its closed position.

18. A modular system according to claim 10 wherein the end face of the grip means is coded so that a viewer can determine which enclosures are located in the racks at each location by viewing the end of the grip that extends through the cover when the cover is in its closed position.

* * * * *